(12) United States Patent
Guillorn et al.

(10) Patent No.: US 8,610,181 B2
(45) Date of Patent: Dec. 17, 2013

(54) V-GROOVE SOURCE/DRAIN MOSFET AND PROCESS FOR FABRICATING SAME

(71) Applicants: Michael A. Guillorn, Yorktown Heights, NY (US); Gen Pei Lauer, Mahopac, NY (US); Isaac Lauer, Mahopac, NY (US); Jeffrey W. Sleight, Ridgefield, CT (US)

(72) Inventors: Michael A. Guillorn, Yorktown Heights, NY (US); Gen Pei Lauer, Mahopac, NY (US); Isaac Lauer, Mahopac, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/624,251

(22) Filed: Sep. 21, 2012

(65) Prior Publication Data
US 2013/0153972 A1    Jun. 20, 2013

Related U.S. Application Data

(63) Continuation of application No. 13/329,604, filed on Dec. 19, 2011.

(51) Int. Cl.
*H01L 27/085* (2006.01)

(52) U.S. Cl.
USPC ............... 257/255; 257/349; 257/E29.004

(58) Field of Classification Search
USPC ............ 257/255, 349, E29.004, E21.7; 438/168, 524
See application file for complete search history.

(56) References Cited

U.S. PATENT DOCUMENTS

| | | | |
|---|---|---|---|
| 4,682,405 A * | 7/1987 | Blanchard et al. | 438/274 |
| 5,323,053 A * | 6/1994 | Luryi et al. | 257/485 |
| 6,075,280 A | 6/2000 | Yung et al. | |
| 6,137,134 A * | 10/2000 | Nakagawa | 257/316 |
| 6,214,680 B1 | 4/2001 | Quek et al. | |
| 7,528,027 B1 | 5/2009 | Zhu et al. | |
| 7,674,667 B2 | 3/2010 | Zhu | |
| 7,728,364 B2 | 6/2010 | Zhu et al. | |
| 7,781,278 B2 | 8/2010 | Zhu | |
| 2003/0218207 A1* | 11/2003 | Hashimoto et al. | 257/315 |
| 2005/0003615 A1* | 1/2005 | Furuhata | 438/257 |
| 2008/0135894 A1* | 6/2008 | Bohr et al. | 257/288 |
| 2008/0169535 A1 | 7/2008 | Butt et al. | |
| 2011/0008940 A1 | 1/2011 | Fung | |

FOREIGN PATENT DOCUMENTS

EP   1873837 A1   1/2008
WO   2007/122646 A1   11/2007

OTHER PUBLICATIONS

Oosterbroek et al., Etching Methodologies in <111>-Oriented Silicon Wafer, Journal of Microelectromechanical Systems, vol. 9, No. 3 Sep. 2000.
Sleight et al., "Challenges and Opportunities for High Performance 32 nm CMOS Technology", IEDM 2006.

* cited by examiner

*Primary Examiner* — Caridad Everhart
(74) *Attorney, Agent, or Firm* — Harrington & Smith

(57) ABSTRACT

A structure includes a substrate containing at least first and second adjacent gate structures on a silicon surface of the substrate and a silicided source/drain region formed in a V-shaped groove between the first and second adjacent gate structures. The silicided source/drain region formed in the V-shaped groove extend substantially from an edge of the first gate structure to an opposing edge of the second gate structure.

15 Claims, 6 Drawing Sheets

V-GROOVE SOURCE/DRAIN MOSFET AND PROCESS FOR FABRICATING SAME

CROSS-REFERENCE TO A RELATED PATENT APPLICATION

This patent application is a continuation patent application of copending U.S. patent application Ser. No. 13/329,604, filed Dec. 19, 2011, the disclosure of which is incorporated by reference herein in its entirety.

TECHNICAL FIELD

The exemplary embodiments of this invention relate generally to semiconductor devices and fabrication techniques and, more specifically, relate to the fabrication of semiconductor transistor devices, such as field effect transistor (FETs) devices employed in random access memory (RAM) and logic circuitry, using a silicon on insulator (SOI) substrate or a bulk substrate.

BACKGROUND

As CMOS density scaling continues the region between adjacent gates becomes smaller, the silicide contact area decreases and the access resistance to the device increases. These factors tend to decrease the potential performance of the devices. Additionally, the geometry of a deep Source/Drain (S/D) region of the device can negatively impact the electrostatic control of the channel by the gate.

Reference with regard to suicide contact area scaling can be made to, for example, "Challenges and Opportunities for High Performance 32 nm CMOS Technology" Sleight, J. W. Lauer, I. Dokumaci, O. Fried, D. M. Guo, D. Haran, B. Narasimha, S. Sheraw, C. Singh, D. Steigerwalt, M. Wang, X. Oldiges, P. Sadana, D. Sung, C. Y. Haensch, W. Khare, M., IEDM 2006, 11-13 Dec. 2006.

SUMMARY

In an exemplary aspect thereof the embodiments of this invention provide a structure that comprises a substrate containing at least first and second adjacent gate structures on a silicon surface of the substrate and a silicided source/drain region formed in a V-shaped groove between the first and second adjacent gate structures. The silicided source/drain region formed in the V-shaped groove extend substantially from an edge of the first gate structure to an opposing edge of the second gate structure.

In another exemplary aspect thereof the embodiments of this invention provide a structure that comprises a substrate containing at least first and second adjacent gate structures disposed on a silicon surface of the substrate, the substrate comprising a silicon on insulator (SOI) layer disposed upon an insulating layer; a V-shaped groove disposed through the silicon surface between the first and second adjacent gate structures, where the V-shaped groove extends substantially from an edge of the first gate structure to an opposing edge of the second gate structure and stops on a Si(111) plane of the SOI layer; a source region and a drain region disposed in the V-shaped groove that extend at least from a bottom of the V-shaped groove to the insulating layer; and silicide covering at least the source region and the drain region.

DETAILED DESCRIPTION

The exemplary embodiments of this invention utilize a groove that exhibits a V-shaped geometry between adjacent FET gates to increase the contact surface area. The V-groove is formed by a crystallographic etch, such as a hydrochloric acid-based chemical vapor etch (HCl CVE), which stops on Si(111) crystal planes. This method forms a self-limiting trench where the depth is determined by the space between the adjacent FET gates and, unlike a RIE process, is insensitive to process time and is thus more controllable. In the embodiments of the structure the S/D implant is performed after formation of the V-groove. Due to the presence of the V-groove between FET gates the S/D implant can be performed using a lower implant energy than a conventional S/D implant, resulting in the formation of a more abrupt junction. The geometry of the final S/D profile is also advantageous with respect to electrostatic considerations, especially in the case of the use of a silicon-on-insulator (SOI) device where the junction is butted to the underlying buried oxide (BOX).

Figure 1:
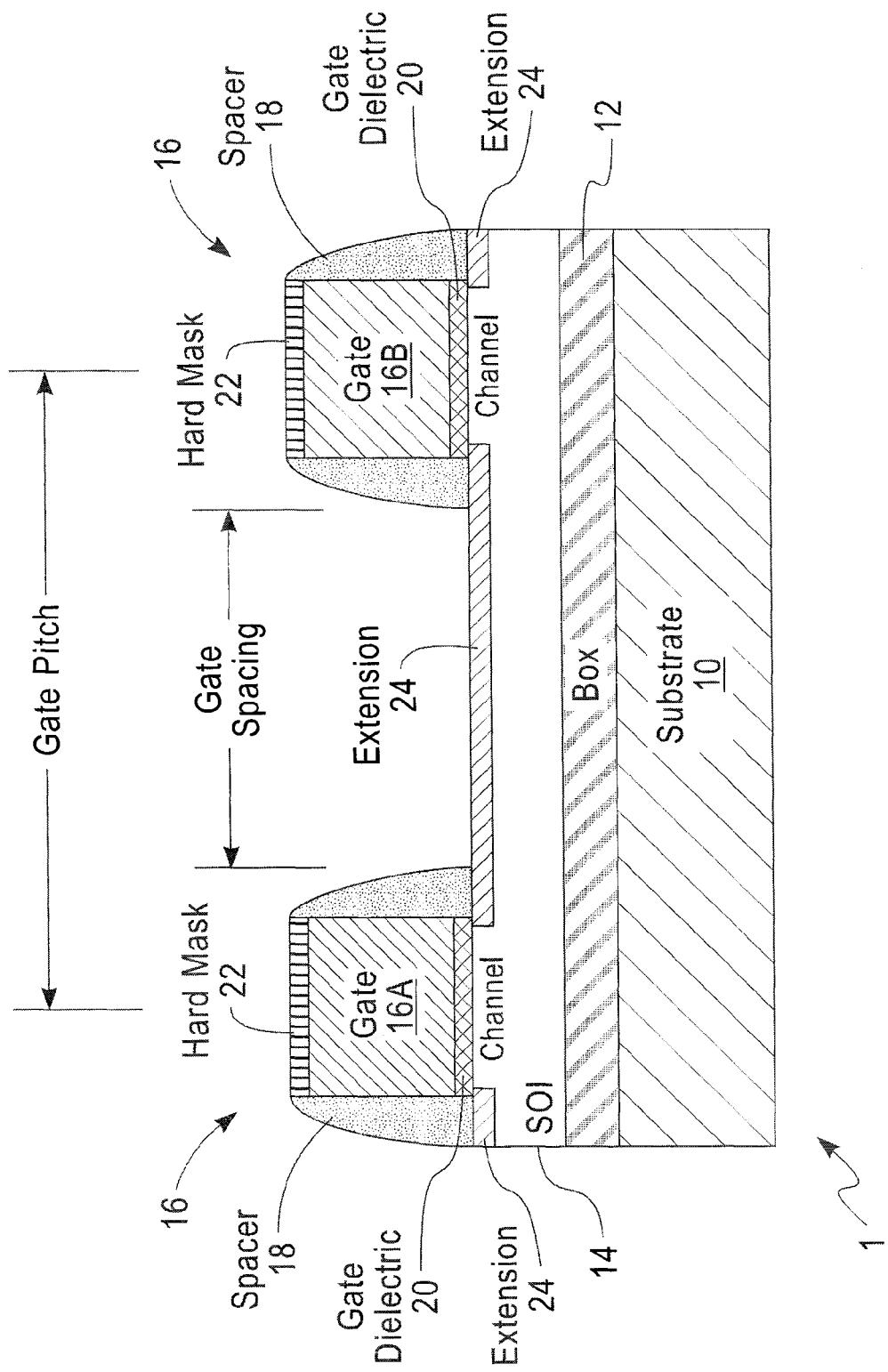
FIG. 1 shows an enlarged cross-sectional view of a small portion of a starting SOI wafer structure having two gate structures already formed.

FIG. 1 shows an enlarged cross-sectional view of a small portion of a starting wafer structure 1. In FIG. 1 and the other figures the layer thicknesses are not drawn to scale. The wafer structure 1 includes a substrate, such as a semiconductor (e.g., Si) substrate 10, an electrically insulating layer which can be referred to as a buried oxide (BOX) layer 12 and a Si top layer, also referred to as an SOI layer 14 or simply as an SOI. The substrate 10 can have any suitable thickness. The BOX 12 can have a thickness in a range of, by example, about 100 nm to about 200 nm (or thicker). The SOI layer 14 can have a thickness in a range of about 20 nm to about 200 nm, with about 100 nm being a suitable thickness for many applications of interest.

The starting wafer structure 1 is assumed to include a plurality of gate stacks or structures 16, two adjacent ones of which are shown in this example. In practice, and as is shown in the top view of FIG. 6, there can be additional gate structures disposed on either side of the two illustrated gate structures 16. The gate structures 16 can be fabricated using any conventional gate-first technique. Typically there can be many thousands or more gate structures 16 present. Each gate structure 16 can include a gate conductor 16A, 16B such as a metal or metal system. Non-limiting examples the gate conductors 16A, 16B can include a metal system comprised of one or more of TiN, TiC, TaN, TaC, TaSiN, HfN, W, Al and Ru that is selected at least in part based on the desired work function (WF) of the device (NFET or PFET), as is known. Each gate structure 16 can also include a layer of a high dielectric constant (high k) material (not shown) disposed between the gate conductor 16, 16B and a spacer 18, such as a layer comprised of a nitride or an oxide. The gate structures

16 will typically also include a thin layer of gate dielectric 20, such as an oxide, between the gate conductor and the surface of the SOI layer 14. A top layer of the gate structure 16 will typically include poly/amorphous Si that overlies one or more of the metal layers at the bottom of the gate structure. A hard mask (HM) 22, such as a nitride or an oxide, is typically also present at this intermediate stage of device fabrication. The gate pitch can be any desired value, such as a value in a range of about 40 nm to about 130 nm. The gate pitch, in conjunction with the gate width, established a gate spacing value which can be, by example, about 30 nm to about 50 nm, with about 40 nm being a suitable value. The gate spacing defines an extent of the surface of the SOI layer 14 between gate structures 16. The SOI surface can be a crystallographic Si(100) plane, where the FET channel direction (beneath the gate conductors 16A, 16B) is in the Si crystallographic Si(110) plane. At this stage of the processing there can be present what will be source/drain (S/D) extension regions 24 already formed into the surface of the SOI 14. The extension regions 24, if present, can have a thickness (depth in the surface of the SOI 14) in a range of about 5 nm to about 20 nm, and can be implanted or diffused to contain a desired type of dopant depending on the type of FET being fabricated, e.g., Arsenic (As) when the FET is to be an n-type FET and Boron (B) when the FET is to be a p-type FET.

It should be noted that while described thus far in the context of an SOI embodiment, the teachings of this invention apply as well to FETs fabricated in and on a bulk semiconductor (e.g., Si) substrate. Also, the embodiments of this invention can be used with other than the gate-first type of processing described. That is, the embodiments can be used with gate-last (replacement gate) processing techniques. In this case the gate structures, instead of containing the gate conductors 16A, 16B, would contain dummy gate (plugs), such as plugs formed from polysilicon, that are subsequently removed prior to depositing the desired gate conductor material to form the functional gate stacks.

Figure 2:
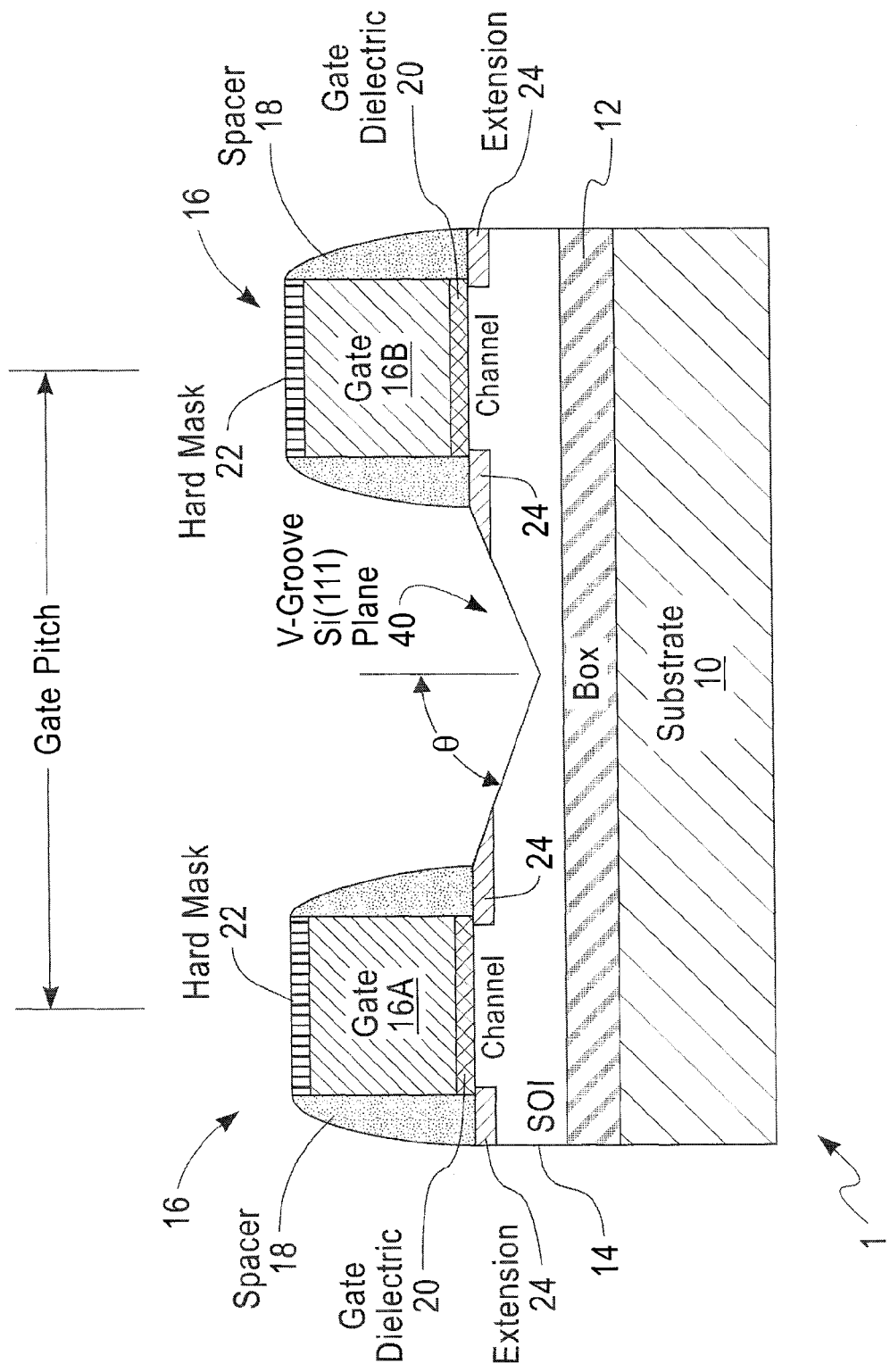
FIG. 2 shows the structure of FIG. 1 after performing an etch process (a hydrochloric acid (HCl)-based CVE process) to form, in accordance with the exemplary embodiments of this invention, a V-shaped groove between the two gate structures.

FIG. 2 shows the structure of FIG. 1 after performing an etch process (a HCl CVE process) to form, in accordance with the exemplary embodiments of this invention, a V-shaped groove 30 between the gate structures 16. The CVE is self-limiting and stops on the crystallographic Si(111) plane of the SOI layer 14. The depth of the V-shaped groove 40 is a function of at least the gate spacing.

In one exemplary process the CVE is performed using HCl only at about 850° C. at about 10 Torr for several minutes (again, the CVE is self-limiting and stops on the Si(111) plane).

In another exemplary process the CVE is performed using a mixture of HCl and germane (GeH$_4$) with about a 5:1 ratio HCl:GeH$_4$ at about 550° C. at about 40 Torr for several minutes in a flow of H$_2$. The germane has been found to aid in catalyzing the HCl etch. Note that the specifics of the etch process are tool-dependent. In an exemplary embodiment the H$_2$ flow is about 8 LPM, while the HCl and GeH$_4$ flows are some 10's of sccm (standard cubic centimeters per minute). In other embodiments a flow of an inert gas can be used such as, for example, N$_2$, Ar or He.

The second CVE process may be preferred for use in some situations due to the lower etch processing temperature, as it is less likely to result in appreciable dopant diffusion in the structure 1.

Note that other CVE processes can be used with variations made in the chemistry, temperature and pressure to form the V-shaped groove 40, and the embodiments of this invention are not limited to only the two examples disclosed above.

The angle θ of the V-groove 40 measured from a surface normal of the SOI layer 14 will nominally be 90°-54.75° or about 35°, where 54.75° is the angle of the Si(111) plane. The V-groove 40 extends substantially from an edge of the first gate structure 16 to an opposing edge of the second gate structure 16.

Figure 3:
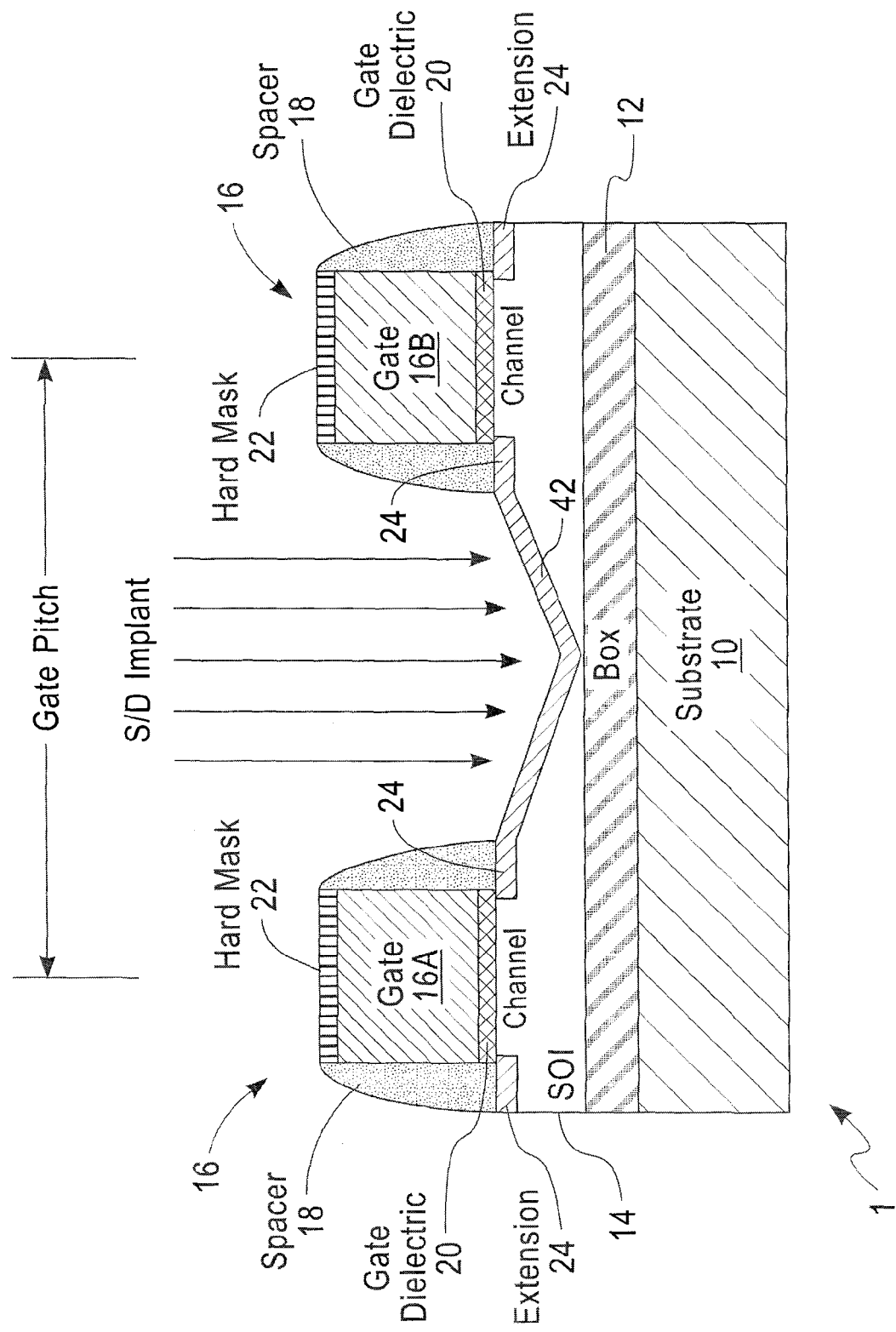
FIG. 3 shows the structure of FIG. 2 when performing a S/D implant.

FIG. 3 shows the structure of FIG. 2 when performing a S/D implant to form an implanted source or drain region 42 that links up with (interfaces with) the extension regions 24 remaining after the CVE. The S/D implant uses any desired dopant species depending on the FET type being fabricated (e.g., As, P, B, etc.), and the implant concentration can be in a typical range of, for example, about $10^{18}$ atoms/cm$^3$ to about $10^{20}$ atoms/cm$^3$ or greater. The extension regions 24 generally extend in the SOI layer 14 from beneath an edge of the gate conductor to a top edge of the V-shaped groove 40 where they merge with the implanted S/D dopant species.

When using the SOI embodiment a goal of the S/D implant is to have the implanted source or drain region 42 reach to the upper surface of the BOX 12, and the formed source or drain can be considered as a deep source or drain. Due to the presence of the V-groove 40 the needed implant energy to form the deep source or drain is less than would be required if the V-groove were not present. This reduction in implant energy at least results in reduced dopant diffusion and the formation of sharper, more well-defined junctions.

The S/D implant depth when using a bulk substrate can be greater than the SOI embodiment to avoid making the junction too abrupt which could result in excess junction leakage. As a non-limiting example a range of about 5 nm to about 20 nm can be used for the S/D implant depth when a bulk Si substrate is used as opposed to the SOI substrate.

Note that the process being described can be especially effective when fabricating stacked transistor embodiments, or when fabricating a folded gate of a single transistor.

Figure 4:
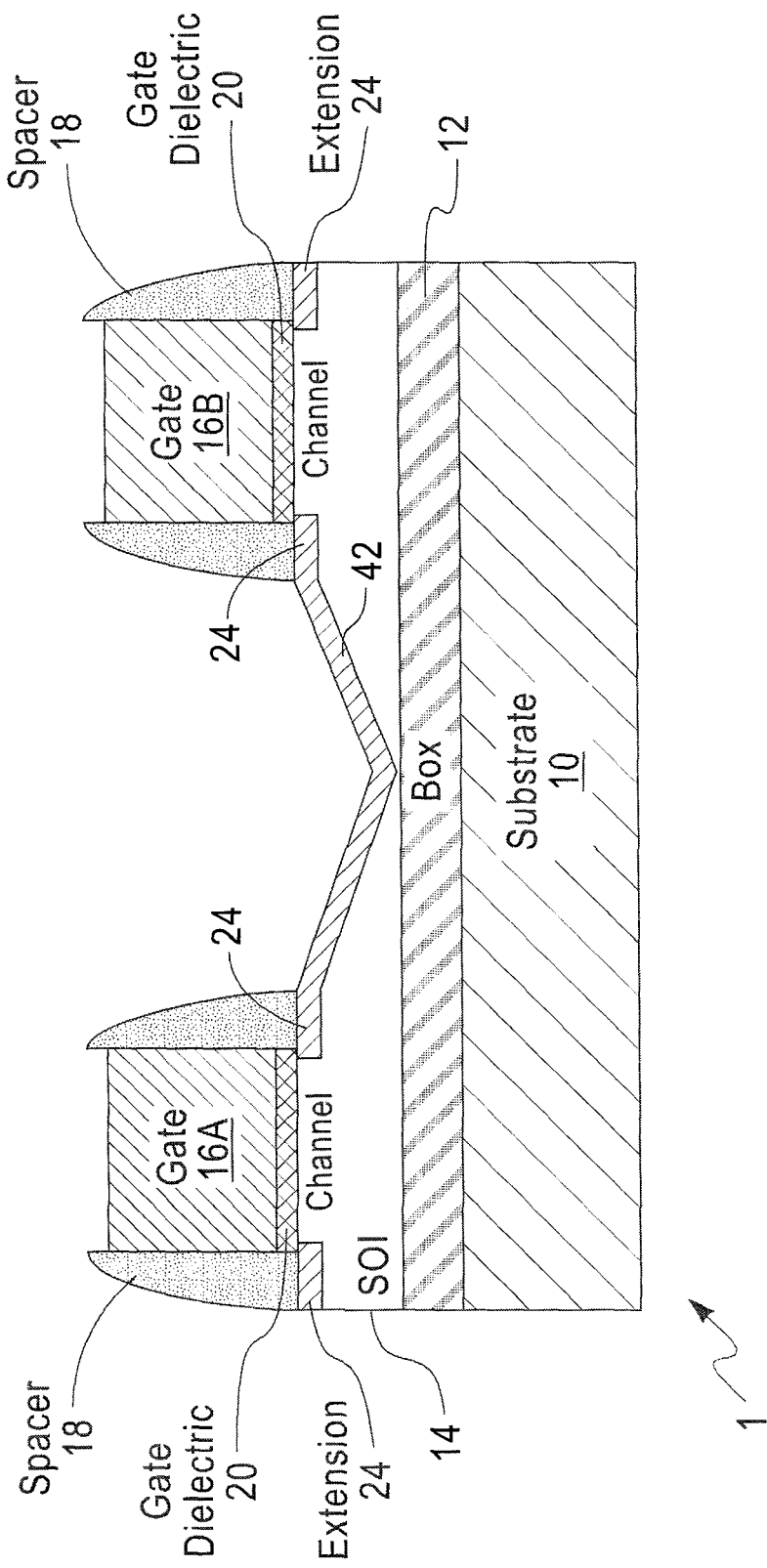
FIG. 4 shows the structure of FIG. 3 after removal of a hard mask from each gate structure.

FIG. 4 shows the structure of FIG. 3 after removal of the hard mask 22. The hard mask 22 can be removed using any conventional technique, including using a selective reactive ion etch (RIE), directional etch and an etch based on, for example, CHF$_3$ or CHF$_4$ or CHF$_4$/H$_2$ chemistry.

Figure 5:
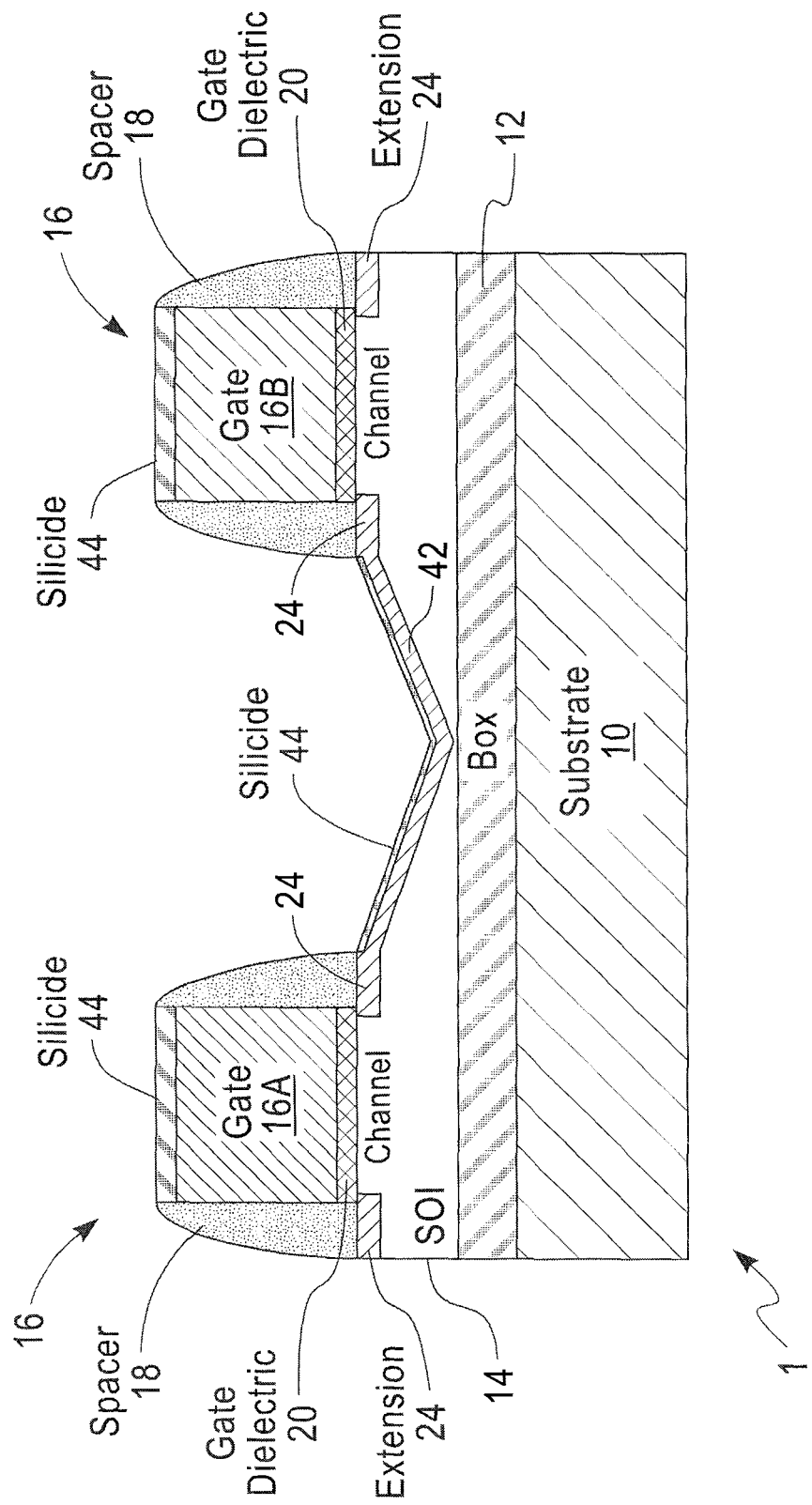
FIG. 5 shows the structure of FIG. 4 after a silicide layer is formed.

FIG. 5 shows the structure of FIG. 4 after a silicide layer 44 is formed. For the gate first embodiment this can be achieved by depositing, for example, a layer of Nickel or Platinum followed by heating to silicide the underlying Si, followed by stripping the un-reacted metal. For the gate last embodiment this can be achieved by depositing, for example, a layer of Cobalt or Platinum or Tungsten followed by heating, followed by stripping the un-reacted metal.

Figure 6:
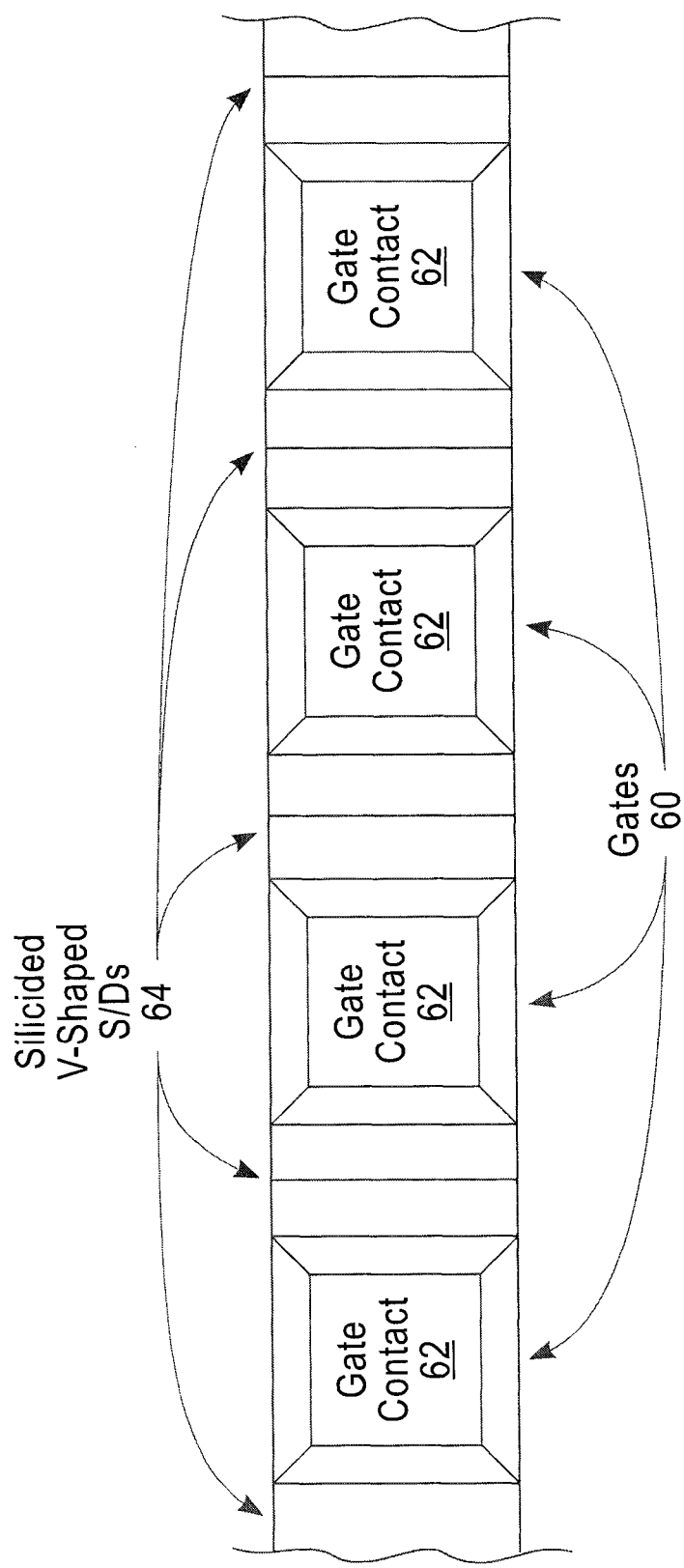
FIG. 6 is an enlarged top view showing a plurality of adjacent FETs having intervening S/Ds with a V-shaped geometry that is a feature of the embodiments of this invention.

FIG. 6 is an enlarged top view showing a plurality of adjacent FETs having intervening S/Ds with V-shaped geometry that is a feature of the embodiments of this invention. Depicted are four adjacent gates 60 each having a silicide gate contact 62 and intervening silicided V-shaped source/drain contacts 64.

The resultant V-shaped S/Ds 64, which provide an increased surface area versus a conventional planar S/D shape, beneficially increases the silicide contact area and thus reduces the access resistance to the device. Additionally, the V-shaped geometry of the deep S/Ds 64 serves to improve the electrostatic control of the associated channel by each of the gates 60.

It is to be understood that although the exemplary embodiments discussed above with reference to FIGS. 1-6 are described with regard to planar devices, the processes described herein may be used on common variants of the FET device including, e.g., FET devices with multi-fingered FIN and/or gate structures, FET devices of varying gate width and length, as well as ring oscillator devices.

Moreover, the transistor device can be connected to metalized pads or other devices by conventional ultra-large-scale integration (ULSI) metalization and lithographic techniques.

It is to be understood that in addition to fabricating transistor device contacts as discussed above, further aspects of the present invention include methods to construct integrated circuits with various analog and digital circuitry. In particular, integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A structure, comprising:
   a substrate containing at least first and second adjacent gate structures on a silicon surface of the substrate; and
   a silicided source/drain region formed in a V-shaped groove between the first and second adjacent gate structures, where the silicided source/drain region formed in the V-shaped groove extends substantially from an edge of the first gate structure to an opposing edge of the second gate structure,
   where the substrate is comprised of a silicon on insulator (SOI) layer disposed upon an insulating layer, and where the source/drain region extends at least from a bottom of the V-shaped groove to the insulating layer.

2. The structure of claim 1, where an angle of the V-shaped groove measured from a substrate normal is about 35°.

3. The structure of claim 1, where a surface of the SOI layer is a Si(100) plane, where a channel direction beneath the gate structures is in a Si(110) plane, and where an angle of the V-shaped groove measured from the surface of the SOI layer is defined by a Si(111) plane of the SOI layer.

4. The structure of claim 1, where a pitch of the gate structures is in a range of about 40 nm to about 130 nm, and where a spacing between an edge of the first gate structure to an opposing edge of the second gate structure is in a range of about 30 nm to about 50 nm.

5. The structure of claim 1, a top portion of each gate structure is also silicided.

6. The structure of claim 1, where the source/drain region interfaces to an extension region that extends in the SOI layer from beneath an edge of a gate conductor to a top edge of the V-shaped groove.

7. A structure, comprising:
   a substrate containing at least first and second adjacent gate structures disposed on a silicon surface of the substrate, the substrate comprising a silicon on insulator (SOI) layer disposed upon an insulating layer;
   a V-shaped groove disposed through the silicon surface between the first and second adjacent gate structures, where the V-shaped groove extends substantially from an edge of the first gate structure to an opposing edge of the second gate structure and stops on a Si(111) plane of the SOI layer; and
   a source region or a drain region disposed in the V-shaped groove that extends at least from a bottom of the V-shaped groove to the insulating layer.

8. The structure of claim 7, further comprising a layer of silicide covering at least the source region or the drain region.

9. The structure of claim 7, where an angle of the V-shaped groove measured from a substrate normal is about 35°.

10. The structure of claim 7, where a surface of the SOI layer is a Si(100) plane, where a channel direction beneath the gate structures is in a Si(110) plane, and where an angle of the V-shaped groove measured from the surface of the SOI layer is defined by the Si(111) plane of the SOI layer.

11. The structure of claim 7, where a pitch of the gate structures is in a range of about 40 nm to about 130 nm, and where a spacing between an edge of the first gate structure to an opposing edge of the second gate structure is in a range of about 30 nm to about 50 nm.

12. The structure of claim 7, where the source region or the drain region is ion implanted into the substrate within the V-shaped groove.

13. The structure of claim 7 where the source region or the drain region merges with a first extension region formed at least partially beneath the first gate structure and with a second extension region formed at least partially beneath the second gate structure.

14. The structure of claim 7, where the V-shaped groove is formed with a chemical vapor etch (CVE) using HCl.

15. The structure of claim 14, where the CVE uses one of HCl only at about 850° C. at about 10 Torr or a mixture of HCl and germane ($GeH_4$) with about a 5:1 ratio HCl:$GeH_4$ at about 550° C. at about 40 Torr in a flow of gas.

* * * * *